United States Patent
Shieh

(10) Patent No.: US 11,602,076 B2
(45) Date of Patent: Mar. 7, 2023

(54) LIQUID-COOLING HEAT DISSIPATION DEVICE

(71) Applicant: Cooler Master Co., Ltd., New Taipei (TW)

(72) Inventor: Tung-Yang Shieh, New Taipei (TW)

(73) Assignee: COOLER MASTER CO., LTD., New Taipei (TW)

(\*) Notice: Subject to any disclaimer, the term of this patent is extended or adjusted under 35 U.S.C. 154(b) by 273 days.

(21) Appl. No.: 16/775,395

(22) Filed: Jan. 29, 2020

(65) Prior Publication Data

US 2021/0176893 A1 Jun. 10, 2021

(30) Foreign Application Priority Data

Dec. 6, 2019 (TW) ................................. 108216287

(51) Int. Cl.
| F28F 7/00 | (2006.01) |
| H05K 7/20 | (2006.01) |
| G06F 1/20 | (2006.01) |

(52) U.S. Cl.
CPC ........... *H05K 7/20272* (2013.01); *G06F 1/20* (2013.01); *H05K 7/20172* (2013.01); *H05K 7/20254* (2013.01); *G06F 2200/201* (2013.01)

(58) Field of Classification Search
CPC ........... H05K 7/20272; H05K 7/20172; H05K 7/20254; G06F 1/20; G06F 2200/201
USPC .............................. 165/80.4, 104.31, 104.33
See application file for complete search history.

(56) References Cited

U.S. PATENT DOCUMENTS

| 5,465,192 A * | 11/1995 | Yoshikawa | H01L 23/433 257/E23.09 |
| 7,360,583 B2 * | 4/2008 | Liu | H01L 23/473 417/313 |
| 7,885,073 B2 * | 2/2011 | Peng | H01L 23/467 165/104.33 |
| 9,927,181 B2 * | 3/2018 | Mounioloux | G06F 1/20 |
| 10,048,008 B1 * | 8/2018 | Mounioloux | F28D 1/05391 |
| 2007/0034353 A1 * | 2/2007 | Liu | H01L 23/473 165/80.4 |
| 2009/0218072 A1 * | 9/2009 | Eriksen | G06F 1/206 165/80.2 |
| 2019/0281730 A1 * | 9/2019 | Gao | H05K 7/20272 |
| 2020/0173728 A1 * | 6/2020 | Pan | G06F 1/20 |
| 2020/0192440 A1 * | 6/2020 | Edwards | H01L 23/473 |
| 2020/0344912 A1 * | 10/2020 | Lai | H05K 7/20272 |
| 2021/0176893 A1 * | 6/2021 | Shieh | H05K 7/20254 |
| 2021/0360825 A1 * | 11/2021 | Wu | H05K 7/20263 |

\* cited by examiner

*Primary Examiner* — Claire E Rojohn, III
(74) *Attorney, Agent, or Firm* — Locke Lord LLP; Tim Tingkang Xia, Esq.

(57) ABSTRACT

The disclosure provides a liquid-cooling heat dissipation device. The liquid-cooling heat dissipation device is configured to be in thermal contact with an expansion card. The liquid-cooling heat dissipation device includes a base plate, a thermally-conductive component and a heat exchanger. The base plate is configured to be mounted on the expansion card. The thermally-conductive component is mounted on the base plate. The thermally-conductive component and the base plate together form a liquid chamber therebetween. The heat exchanger is mounted on the base plate and connected to the liquid chamber.

13 Claims, 6 Drawing Sheets

LIQUID-COOLING HEAT DISSIPATION DEVICE

CROSS-REFERENCE TO RELATED APPLICATIONS

This non-provisional application claims priority under 35 U.S.C. § 119(a) on Patent Application No(s). 108216287 filed in R.O.C, Taiwan on Dec. 6, 2019, the entire contents of which are hereby incorporated by reference.

TECHNICAL FIELD

The disclosure relates to a heat dissipation device, more particularly to a liquid-cooling heat dissipation device.

BACKGROUND

As technology progresses and develops, computers are widely used and indispensable in daily life. In order to satisfy the various function requirements, the motherboard has expansion slots for adding expansion cards, such as graphic cards, sound card and/or network interface cards. In general, the internal space of the computer is very limited, and which often makes it difficult to accommodate the required expansion cards. Also, the expansion cards produce heat during operation, and the heat may cause damage to its electronic component if the heat is not timely and effectively removed.

In some cases, a liquid cooling system is an effective option to dissipate heat generated by the expansion cards. A typical liquid cooling system is consisted of a heat sink, a heat exchanger, and a pump. The coolant is pumped to the heat sink to absorb heat, and then the coolant is pumped to the heat exchanger to be cooled. However, the heat sink, the heat exchanger, and the pump are scattered in different places, such that the liquid cooling system usually occupies a large range of space. Also, the relative location of the heat sink, the heat exchanger, and the pump are fixed, which makes the liquid cooling system even more difficult to fit different available internal space of computer. Therefore, how to avoid the expansion card from occupying too much space in the computer while increasing the heat dissipation efficiency becomes a hot topic in the files.

SUMMARY OF THE INVENTION

The disclosure provides a liquid-cooling heat dissipation device which can effectively utilize the space in the computer and increasing heat dissipation efficiency to the expansion card.

One embodiment of the disclosure provides a liquid-cooling heat dissipation device. The liquid-cooling heat dissipation device is configured to be in thermal contact with an expansion card. The liquid-cooling heat dissipation device includes a base plate, a thermally-conductive component and a heat exchanger. The base plate is configured to be mounted on the expansion card. The thermally-conductive component is mounted on the base plate. The thermally-conductive component and the base plate together form a liquid chamber therebetween. The heat exchanger is mounted on the base plate and connected to the liquid chamber.

According to the liquid-cooling heat dissipation devices as discussed above, the way of stacking the base plate, the thermally-conductive component, and the heat exchanger can reduce the space they occupy. As a result, the liquid-cooling heat dissipation device would not occupy a large space in a computer while increasing the heat dissipation efficiency to the expansion card.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
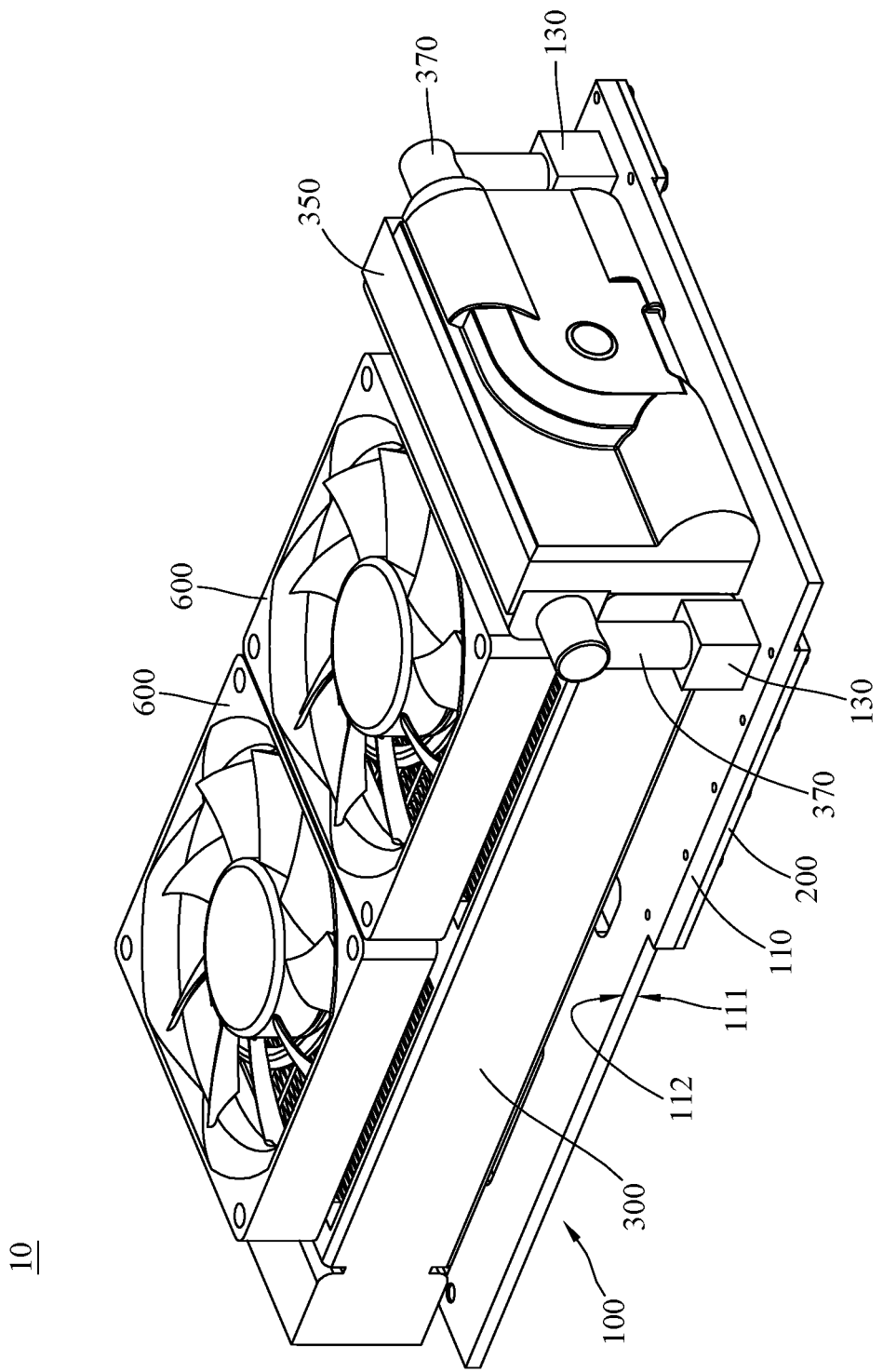
FIG. 1 is a perspective view of a liquid-cooling heat dissipation device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
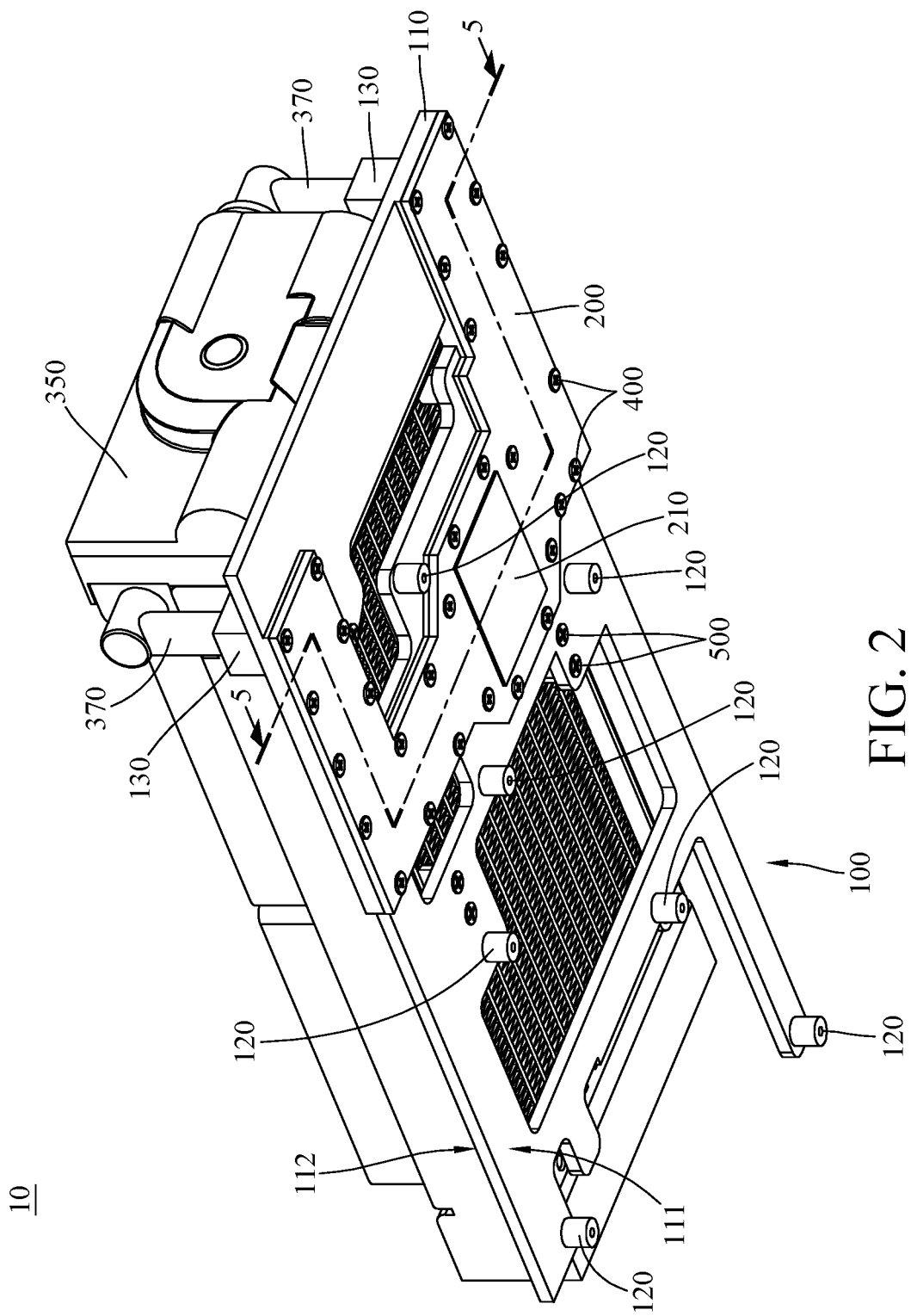
FIG. 2 is another perspective view of the liquid-cooling heat dissipation device in FIG. 1.
Figure 3:
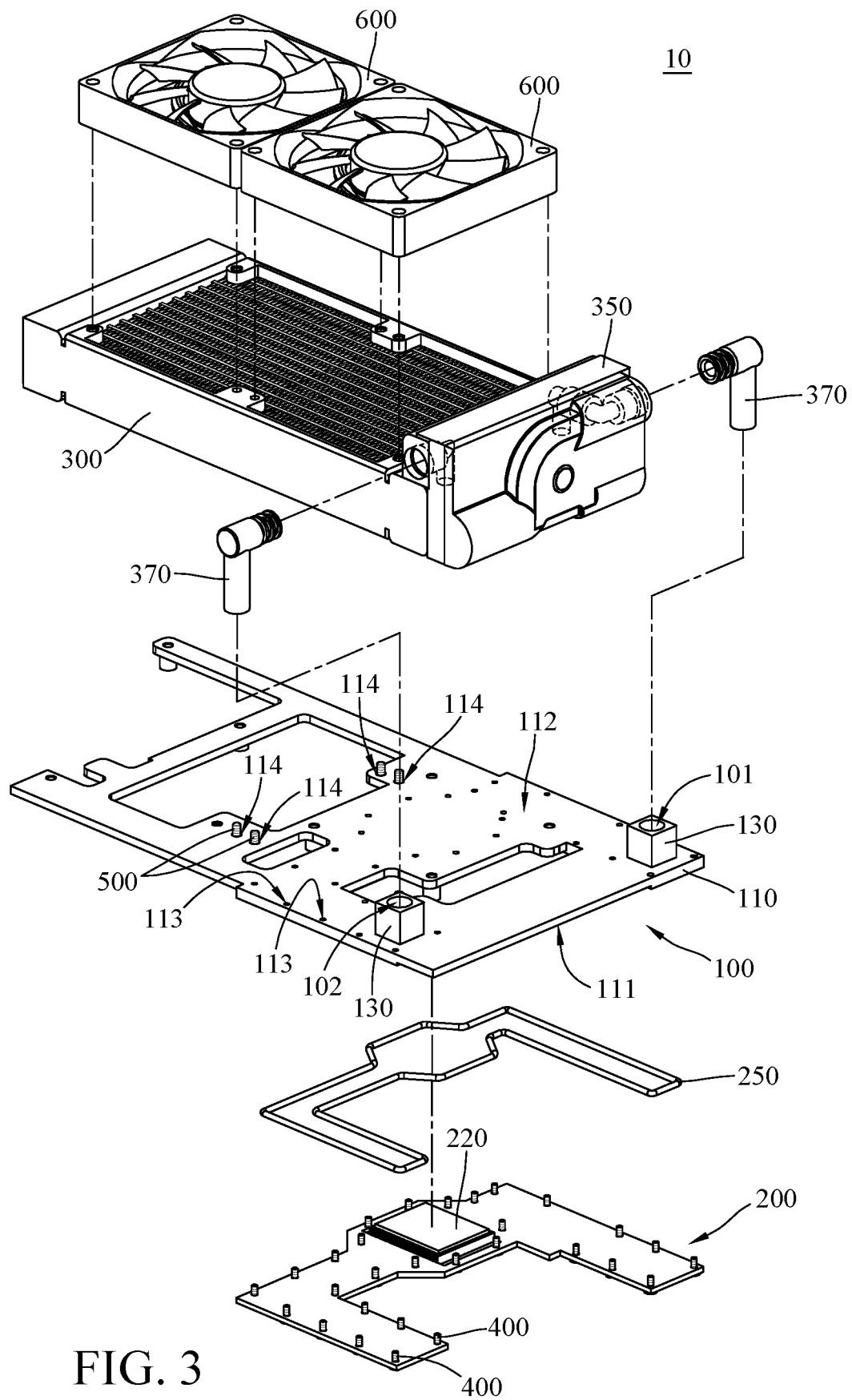
FIG. 3 is an exploded view of the liquid-cooling heat dissipation device in FIG. 1.
Figure 4:
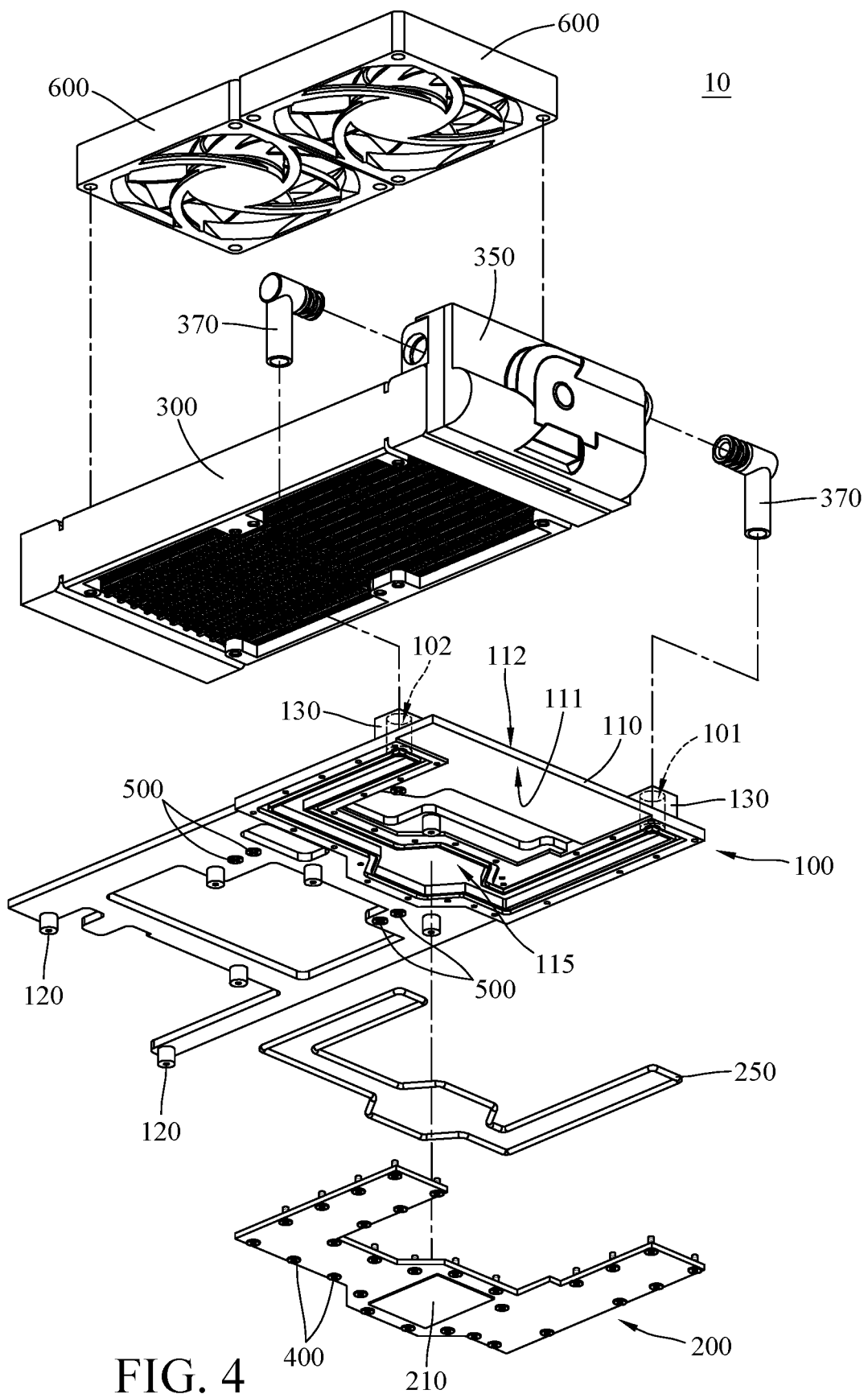
FIG. 4 is another exploded view of the liquid-cooling heat dissipation device in FIG. 1.

Referring to FIGS. 1 to 4, where FIG. 1 is a perspective view of a liquid-cooling heat dissipation device 10 according to a first embodiment of the disclosure; FIG. 2 is another perspective view of the liquid-cooling heat dissipation device 10 in FIG. 1, FIG. 3 is an exploded view of the liquid-cooling heat dissipation device 10 in FIG. 1, and FIG. 4 is another exploded view of the liquid-cooling heat dissipation device 10 in FIG. 1.

Figure 5:
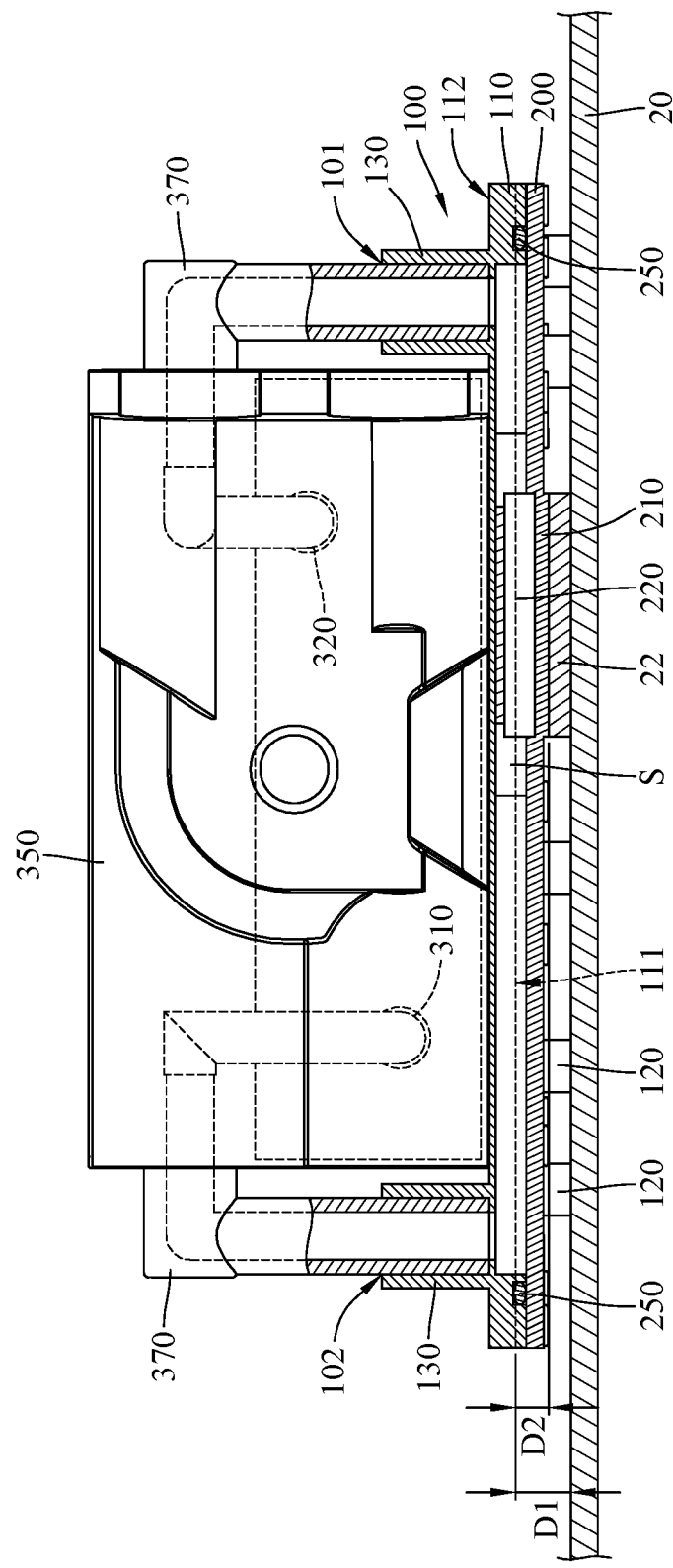
FIG. 5 is a side view of the liquid-cooling heat dissipation device in FIG. 1 with an expansion card.

In this embodiment, the liquid-cooling heat dissipation device 10 is configured to be in thermal contact with an expansion card (e.g., the expansion card 20 shown in FIG. 5). The expansion card 20 is, for example, a graphic card. The liquid-cooling heat dissipation device 10 includes a base plate 100, a thermally-conductive component 200 and a heat exchanger 300. In addition, the liquid-cooling heat dissipation device 10 further includes a plurality of first fasteners 400 and a plurality of second fasteners 500. The thermally-conductive component 200 is mounted on the base plate 100 via the first fasteners 400. The heat exchanger 300 is mounted on the base plate 100 via the second fasteners 500.

The base plate 100 is configured to be mounted on the expansion card 20. The base plate 100 includes a plate body 110, a plurality of mount pillars 120, and two pipe connectors 130. The plate body 110 has a first surface 111 and a second surface 112 facing away from the first surface 111. The mount pillars 120 protrude from the first surface 111 of the plate body 110. The mount pillars 120 are configured to be mounted to the expansion card 20. The pipe connectors 130 protrude from the second surface 112 of the plate body 110.

Moreover, the plate body 110 has a plurality of first fixing holes 113 and a plurality of second fixing holes 114. The first fixing holes 113 are, for example, screw holes. The first fixing holes 113 penetrate through the first surface 111 and the second surface 112; that is, the first fixing holes 113 are through holes, but the present disclosure is not limited thereto. In some other embodiments, the first fixing holes may be blind holes formed on the second surface. The second fixing holes 114 are, for example, screw holes. The second fixing holes 114 penetrate through the first surface 111 and the second surface 112 of the plate body 110.

The pipe connectors 130 protrude from the second surface 112 of the plate body 110. The base plate 100 has a first liquid inlet 101 and a first liquid outlet 102. The first liquid inlet 101 and the first liquid outlet 102 are respectively located at the pipe connectors 130. In addition, the plate body 110 has a recess 115 formed on the first surface 111 of the plate body 110 and is connected to the first liquid inlet 101 and the first liquid outlet 102.

The thermally-conductive component 200 is made of, for example, copper. The thermally-conductive component 200 is mounted to the first fixing holes 113 of the plate body 110 via the first fasteners 400; specifically, the first fasteners 400 are disposed through the thermally-conductive component 200 and fixed to the first fixing holes 113 so as to mount the thermally-conductive component 200 on the first surface 111 of the plate body 110. The plate body 110 of the base plate 100 and the thermally-conductive component 200 together form a liquid chamber S therebetween. The thermally-conductive component 200 has a protrusion portion 210 and a heat sink 220. The protrusion portion 210 protrudes along a direction away from the first surface 111 of the plate body 110. The heat sink 220 is located in the liquid chamber S. The heat sink 220 assists the heat transferring between the working fluid in the liquid chamber S and the thermally-conductive component 200. In this embodiment, there is a sealing component 250 located between and clamped by the thermally-conductive component 200 and the plate body 110 so as to prevent working fluid in the liquid chamber S from leaking.

The heat exchanger 300 is mounted to the second fixing holes 114 of the plate body 110 via the second fasteners 500 and covers the second surface 112 of the plate body 110; specifically, the second fasteners 500 are disposed through the second fixing holes 114 and fixed to the heat exchanger 300 so as to fix the heat exchanger 300 on the plate body 110. As shown, the thermally-conductive component 200 and the heat exchanger 300 are respectively located at two opposite sides of the plate body 110 of the base plate 100. The heat exchanger 300 has a second liquid inlet 310 and a second liquid outlet 320. The second liquid inlet 310 and the second liquid outlet 320 of the heat exchanger 300 are respectively connected to the first liquid outlet 102 and the first liquid inlet 101 located on the pipe connectors 130.

In this embodiment, the liquid-cooling heat dissipation device 10 further includes a pump 350 and two rigid pipes 370. The pump 350 is mounted on the heat exchanger 300. The first liquid inlet 101 and the first liquid outlet 102 are respectively connected to the second liquid outlet 320 and the second liquid inlet 310 via the rigid pipes 370, and the pump 350 connects the second liquid outlet 320 and the second liquid inlet 310, such that the liquid chamber S, the second liquid inlet 310, the second liquid outlet 320, the rigid pipes 370, the first liquid inlet 101, the first liquid inlet 102 and the pump 350 together form a loop. In this embodiment, the rigid pipes 370 is difficult to be deformed, and which facilitates the installation of the rigid pipes 370.

Note that the liquid-cooling heat dissipation device 10 is not restricted to have the pump 350; in some other embodiments, the liquid-cooling heat dissipation device may have no pump. In such a case, liquid in the liquid-cooling heat dissipation device can be driven merely by internal pressure difference.

In this embodiment, the liquid-cooling heat dissipation device 10 further includes two fans 600. The fans 600 are mounted on the heat exchanger 300 and located at a side of the heat exchanger 300 away from the plate body 110.

Note that the quantity and position of the fans 600 are not restricted; in another embodiment, the liquid-cooling heat dissipation device may include only one fan; in still another embodiment, the fan may be located a side of the heat exchanger close to the plate body.

Referring to FIG. 5, where FIG. 5 is a side view of the liquid-cooling heat dissipation device 10 in FIG. 1 with the expansion card 20. In this embodiment, the height D1 of the mount pillar 120 from the first surface 111 of the plate body 110 is larger than the height D2 of the protrusion portion 210 of the thermally-conductive component 200 from the first surface 111 of the plate body 110; that is, an end of each mount pillar 120 is located farther away from the first surface 111 of the plate body 110 than a surface of the protrusion portion 210 facing away from the first surface 111 of the plate body 110. The difference between the heights D1 and D2 is substantially equal to the thickness of a chip 22 of the expansion card 20.

As shown in FIG. 5, the way of stacking the base plate 100, the thermally-conductive component 200, and the heat exchanger 300 can reduce the space they occupy. As a result, the liquid-cooling heat dissipation device 10 would not occupy a large space in a computer (not shown) while increasing the heat dissipation efficiency to the expansion card 20. In addition, it is understood that the pump 350 is also stacked on the heat exchanger 300, thus the pump 350 does not significantly increase the overall volume of the liquid-cooling heat dissipation device 10.

Figure 6:
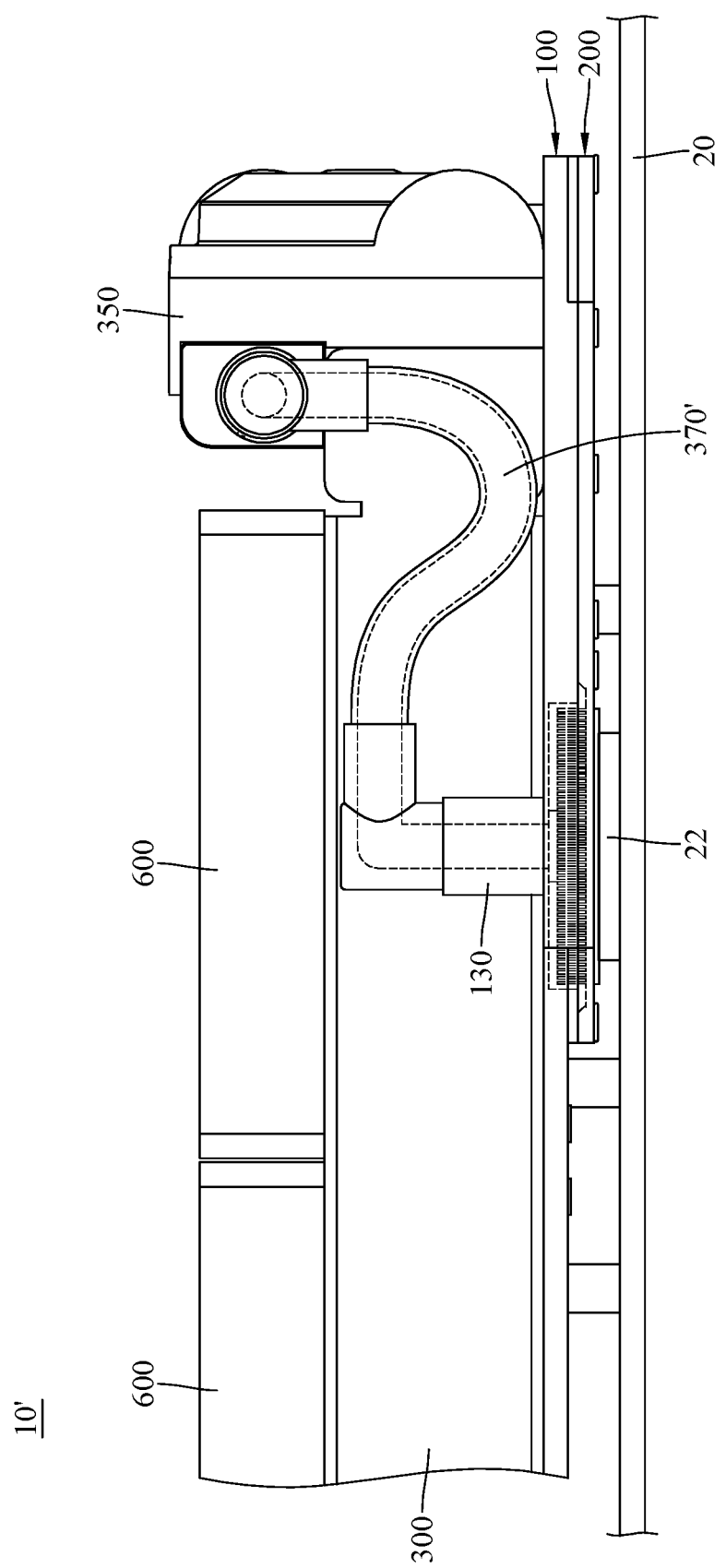
FIG. 6 is a side view of a liquid-cooling heat dissipation device according to a second embodiment of the disclosure.

Referring to FIG. 6, where FIG. 6 is a side view of a liquid-cooling heat dissipation device 10' according to a second embodiment of the disclosure.

Note that one of the main differences between the liquid-cooling heat dissipation device 10' and the liquid-cooling heat dissipation device 10 illustrated in the previous embodiment is the configuration of the pipes, thus only the differences will be specifically described below, and the same and similar parts may be briefly described or not be repeated.

In this embodiment, the liquid-cooling heat dissipation device 10' is similar to the liquid-cooling heat dissipation device 10 but the rigid pipes 370 are replaced with two flexible pipes 370'. In such a case, the first liquid inlet 101 (shown in FIG. 5) and the first liquid outlet 102 (shown in FIG. 5) are respectively connected to the second liquid outlet 320 (shown in FIG. 5) and the second liquid inlet 310 (shown in FIG. 5) via the flexible pipes 370'.

According to the liquid-cooling heat dissipation devices as discussed above, the way of stacking the base plate, the thermally-conductive component, and the heat exchanger can reduce the space they occupy. As a result, the liquid-cooling heat dissipation device would not occupy a large space in a computer while increasing the heat dissipation efficiency to the expansion card. In addition, it is understood that the pump is also stacked on the heat exchanger, thus the pump does not significantly increase the overall volume of the liquid-cooling heat dissipation device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A liquid-cooling heat dissipation device, configured to be in thermal contact with an expansion card, comprising:
   a base plate, configured to be mounted on the expansion card;
   a thermally-conductive component, mounted on the base plate, wherein the thermally-conductive component and the base plate together form a liquid chamber therebetween; and
   a heat exchanger, mounted on the base plate and connected to the liquid chamber;
   wherein the base plate comprises a plate body, the plate body has a first surface and a second surface, the first surface faces away from the heat exchanger, the second surface faces away from the first surface and faces the heat exchanger, and the liquid chamber is on the first surface of the plate body facing away from the heat exchanger;
   wherein the liquid-cooling heat dissipation device further comprises a sealing component surrounding the liquid chamber and located between and clamped by the thermally-conductive component and the first surface of the plate body;
   wherein the plate body has two through holes, and the liquid chamber is located between the two through holes.

2. The liquid-cooling heat dissipation device according to claim 1, further comprising a pump mounted on the heat exchanger.

3. The liquid-cooling heat dissipation device according to claim 1, wherein the base plate further comprises a plurality of mount pillars, the plurality of mount pillars protrude from the first surface, and the plurality of the mount pillars are configured to be mounted on the expansion card.

4. The liquid-cooling heat dissipation device according to claim 3, wherein the thermally-conductive component and the heat exchanger are respectively located at two opposite sides of the plate body of the base plate.

5. The liquid-cooling heat dissipation device according to claim 3, further comprising a plurality of first fasteners, the plate body has a plurality of first fixing holes, the plurality of first fixing holes are located at the first surface, and the thermally-conductive component is mounted to the plurality of first fixing holes via the plurality of first fasteners.

6. The liquid-cooling heat dissipation device according to claim 5, further comprising a plurality of second fasteners, the plate body further has a plurality of second fixing holes, the plurality of second fixing holes penetrate through the first surface and the second surface of the plate body, the plurality of second fasteners are respectively disposed through the plurality of second fixing holes and fixed to the heat exchanger.

7. The liquid-cooling heat dissipation device according to claim 6, wherein a height of each of the plurality of mount pillars from the first surface of the plate body is larger than a height of the thermally-conductive component from the first surface of the plate body.

8. The liquid-cooling heat dissipation device according to claim 1, further comprising at least one fan mounted on the heat exchanger.

9. The liquid-cooling heat dissipation device according to claim 8, wherein the at least one fan is located at a side of the heat exchanger away from the plate body of the base plate.

10. The liquid-cooling heat dissipation device according to claim 1, wherein the base plate has a first liquid inlet and a first liquid outlet, the heat exchanger has a second liquid inlet and a second liquid outlet, the first liquid outlet is connected to the second liquid inlet, the second liquid outlet is connected to the first liquid inlet.

11. The liquid-cooling heat dissipation device according to claim 10, wherein the base plate further comprises two pipe connectors, the pipe connectors protrude from the second surface of the plate body, and the first liquid inlet and the first liquid outlet are respectively located at the two pipe connectors.

12. The liquid-cooling heat dissipation device according to claim 11, further comprising two flexible pipes, the first liquid inlet and the first liquid outlet are respectively connected to the second liquid outlet and the second liquid inlet via the two flexible pipes.

13. The liquid-cooling heat dissipation device according to claim 11, further comprising two rigid pipes, the first liquid inlet and the first liquid outlet are respectively connected to the second liquid outlet and the second liquid inlet via the two rigid pipes.

* * * * *